(12) United States Patent
Hayashi et al.

(10) Patent No.: US 7,193,241 B2
(45) Date of Patent: Mar. 20, 2007

(54) ULTRAVIOLET SENSOR AND METHOD FOR MANUFACTURING THE SAME

(75) Inventors: Kazushi Hayashi, Kobe (JP); Takeshi Tachibana, Kobe (JP); Yoshihiro Yokota, Kobe (JP); Nobuyuki Kawakami, Kobe (JP)

(73) Assignee: Kabushiki Kaisha Kobe Seiko Sho, Hyogo (JP)

( * ) Notice: Subject to any disclaimer, the term of this patent is extended or adjusted under 35 U.S.C. 154(b) by 0 days.

(21) Appl. No.: 11/057,603

(22) Filed: Feb. 15, 2005

(65) Prior Publication Data

US 2005/0181122 A1    Aug. 18, 2005

(30) Foreign Application Priority Data

Feb. 16, 2004    (JP) .............................. 2004-039083

(51) Int. Cl.
*H01L 29/15* (2006.01)
*H01L 31/00* (2006.01)

(52) U.S. Cl. ................. 257/77; 257/226; 257/440

(58) Field of Classification Search ................ 257/77, 257/226, 440, 323.14, E31.954, E23.111, 257/417; 313/531, 530
See application file for complete search history.

(56) References Cited

U.S. PATENT DOCUMENTS 6,080,378 A * 6/2000 Yokota et al. ............... 423/446

2005/0174052 A1 * 8/2005 Niigaki et al. ............. 313/530

FOREIGN PATENT DOCUMENTS

| JP | 5-335613 | 6/1992 |
|----|----------|--------|
| JP | 11-248531 | 3/1998 |

* cited by examiner

*Primary Examiner*—Long Tran
(74) *Attorney, Agent, or Firm*—Reed Smith LLP; Stanley P. Fisher, Esq.; Juan Carlos A. Marquez, Esq.

(57) ABSTRACT

An ultraviolet sensor includes a substrate; a diamond layer, placed on the substrate, functioning as a detector; and at least one pair of surface electrodes arranged on the diamond layer. The diamond layer has a detecting region present at the surface thereof, the detecting region has at least one sub-region exposed from the surface electrodes, and the sub-region has a covering layer, made of oxide or fluoride, lying thereon. A method for manufacturing the ultraviolet sensor includes a step of forming a diamond layer, functioning as a detector, on a substrate; a step of forming at least one pair of surface electrodes on the diamond layer; and a step of forming a covering layer, made of oxide or fluoride, on at least one sub-region of a detecting region present at the surface of the diamond layer, the sub-region being exposed from the surface electrodes.

3 Claims, 4 Drawing Sheets

ULTRAVIOLET SENSOR AND METHOD FOR MANUFACTURING THE SAME

BACKGROUND OF THE INVENTION

1. Field of the Invention

The present invention relates to ultraviolet sensors, including diamond films, for detecting ultraviolet light without being affected by solar light and also relates to method for manufacturing such sensors. The present invention particularly relates to an ultraviolet sensor including a highly oriented diamond film and a method for manufacturing such a sensor.

2. Description of the Related Art

In recent years, various ultraviolet sensors have been proposed (see, for example, Japanese Unexamined Patent Application Publication Nos. 5-335613 and 11-248531; UV Photodetectors from Thin Film Diamond; Phys. Stat. Sol. (a), 1996, vol. 154, pp. 445–454; Diamond UV photodetectors: sensitivity and speed for visible blind applications; Diamond and Related Materials, 1998, vol. 7, pp. 513–518; Polycrystalline diamond photoconductive device with high UV-visible discrimination; and Appl. Phys. Lett., 1995, vol. 67, pp. 2117–2119). Such diamond films are useful in manufacturing highly reliable sensors with low cost because they have high resistivity to high temperature, durability, and nature of semiconductor elements having a wide band gap. Semiconductor sensors including the diamond films are superior in durability as compared to known sensor devices including wavelength filters and silicon films or the like with a narrow band gap. Furthermore, there is an advantage in that the semiconductor sensors need not include complicated circuits and are smaller in size and weight as compared to known sensors including phototubes or the like.

In order to reduce manufacturing cost, the ultraviolet sensors disclosed in the above documents usually include polycrystalline diamond films formed by a vapor deposition process and each include, for example, a pair of electrodes arranged thereon. FIG. 5 is a schematic sectional view showing a known ultraviolet sensor 100 with a coplanar structure. The known ultraviolet sensor 100 includes, for example, an insulating substrate 101 made of $Al_2O_3$ or the like; a polycrystalline diamond layer 102 placed thereon; and a pair of interdigital electrodes 103, made of gold or the like, lying on the polycrystalline diamond layer 102.

When the ultraviolet sensor 100 is irradiated with light, electron-hole pairs are generated in the polycrystalline diamond layer 102. The interdigital electrodes 103 collect the electron and hole to output electric signals if a bias voltage is applied between the interdigital electrodes 103. Such a type of ultraviolet sensor, which is referred to as a photoconductor in general, is electrically insulative when it is not irradiated with light but is electrically conductive when it is irradiated with light.

In each known ultraviolet sensor described above, the polycrystalline diamond film functioning as a detector is exposed between the electrodes. Therefore, in order to measure short-wavelength light such as ultraviolet light with a wavelength 200 nm or less, the known ultraviolet sensors have the problems below.

The first problem is that organic compounds present in an atmosphere are decomposed during the irradiation because of the high energy of the short-wavelength light and the decomposed products adhere to the surfaces of the sensors. The adhesion of the decomposed products to the sensor surfaces reduces the amount of incident light to decrease the intensity of detected signals. The second problem is that moisture adsorbed on the sensor surfaces is dissociated into ions if the moisture is irradiated with strong ultraviolet light. Such ions cause a decrease in electrical resistance because they are caused to migrate on the sensor surfaces readily and slowly by an electric field applied between the electrodes. In this case, since the output of the sensors varies over several hundred seconds at the start or end of the ultraviolet irradiation, an output corresponding to the intensity of light cannot be obtained.

In order to solve these problems, an ultraviolet sensor disclosed in Japanese Unexamined Patent Application Publication No. 11-248531 is placed in a package, which is hermetically sealed and the atmosphere in which is replaced with an inert gas such as nitrogen, whereby reverse effects of the ambient atmosphere are omitted. However, the use of such a sealed package causes an increase in the number of manufacturing steps and an increase in the number of optical components and this causes an increase in manufacturing cost. Furthermore, since it is substantially impossible to completely remove moisture and organic compounds adsorbed on the inner surface of the package in advance, the moisture and the organic compounds remain semi-permanently in the package to cause contamination in the package and this causes a deterioration in properties in some cases. For the sensor, the sealed package has a window, made of ultraviolet-transmissive glass or sapphire, for introducing ultraviolet light into the package. Since the window absorbs ultraviolet light in some cases, obtained output is smaller than that of a sensor having no sealed structure depending on the wavelength of the ultraviolet light.

In general, a photodiode-type sensor containing a semiconductor material, such as silicon, other than diamond includes a depletion layer due to a Schottky or pn junction. This type of sensor has an advantage in that the depletion layer functioning as a detector is hardly affected by disturbance because it is placed in the solid diode, an advantage in that satisfactory properties can be obtained because a high electric field is applied only to the depletion layer, and other advantages. However, such a Schottky or pn junction cannot be substantially formed in any diamond film; hence, no photodiode-type sensor including any diamond film can be used.

The following sensor is known: a vertical ultraviolet sensor including a conductive substrate, a polycrystalline diamond layer placed thereon, and an electrode lying over the layer. FIG. 6 is a schematic sectional view showing the known vertical ultraviolet sensor. With reference to FIG. 6, the vertical ultraviolet sensor 104 includes a conductive substrate 105, made of silicon or the like, having low resistance; a polycrystalline diamond layer 102 placed thereon; and an electrode 106 which is made of gold or the like, which has a thickness of about 200 Å, and which lies over the polycrystalline diamond layer 102. In the vertical ultraviolet sensor 104, a bias voltage is applied between the conductive substrate 105 and the electrode 106.

The vertical ultraviolet sensor 104 is only slightly affected by organic compounds and moisture adsorbed thereon. However, there is a problem in that the vertical ultraviolet sensor 104 has unsatisfactory properties because the polycrystalline diamond layer 102 has a high density of grain boundaries present close to the conductive substrate 105 and therefore has a high density of crystal defects if the polycrystalline diamond layer 102 is formed by a vapor deposition process. The crystal defect density can be reduced by increasing the thickness of the polycrystalline diamond layer 102 and polishing the rear face thereof; however, this technique causes a serious increase in manufacturing cost and cannot therefore be applied to a sensor for mass production. Furthermore, there is a problem in that the vertical ultraviolet sensor 104 has low detection efficiency because the electrode 106 lies over the polycrystalline diamond layer 102 functioning as a detector and reflects or absorbs ultraviolet light.

SUMMARY OF THE INVENTION

The present invention has been made to solve the above problems. It is an object of the present invention to provide an ultraviolet sensor, manufactured with low cost, having a constant responsivity that does not change for a long time and also provide a method for manufacturing the ultraviolet sensor.

An ultraviolet sensor includes a substrate; a diamond layer, placed on the substrate, functioning as a detector; and at least one pair of surface electrodes arranged on the diamond layer. The diamond layer has a detecting region present at the surface thereof, the detecting region has at least one sub-region exposed from the surface electrodes, and the sub-region has a covering layer, made of oxide or fluoride, lying thereon.

The detecting region is herein defined as a zone of a surface of the diamond layer, the zone extending between the electrodes and surrounding the electrodes, that is, area spaced from the electrode at a predetermined distance. The predetermined distance is referred to as diffusion length in general. The sub-region of the detecting region is herein defined as a portion of the diamond layer, the portion being exposed from the surface electrodes.

In order to achieve the above object, the inventors have performed an intensive investigation and then found that when an exposed section of the diamond layer is covered with an oxide layer or a fluoride layer, moisture and organic compounds hardly adhere to the covered section and the sensor therefore has a constant responsibility. In the present invention, the oxide layer or the fluoride layer is placed on the sub-region of the detecting region that is not covered with the electrodes. Therefore, moisture and organic compounds can be prevented from adhering to the exposed section of the diamond layer.

The oxide layer preferably contains at least one selected from the group consisting of alumina, silica, titania, and zirconia. The fluoride layer preferably contains at least one of calcium fluoride and magnesium fluoride. This prevents the adhesion of moisture and organic compounds without causing a deterioration in electric properties of the diamond layer and the ultraviolet transmittance thereof.

In the ultraviolet sensor, the diamond layer preferably has a (100) surface and crystal grains which are arranged at the (100) surface, which are oriented in a single direction, and of which the in-plane directions are aligned with each other. Such a layer is known to a highly oriented diamond layer and is herein defined as a layer, made of polycrystalline diamond, having crystal grains of which the growth directions are aligned with each other and of which the in-plane directions are also aligned with each other. The diamond layer has a characteristic surface at which smooth (001) facets are arranged. Therefore, the diamond layer has a smaller number of crystal defects present at the surface thereof as compared to ordinary polycrystalline layers; hence, the diamond layer has a carrier mobility that is one order greater than that of known one. Thus, the ultraviolet sensor has higher detection performance as compared to known ultraviolet sensors.

In a method for manufacturing the ultraviolet sensor according to the present invention, the covering layer may be formed by, for example, a sputtering process, a vapor deposition process, a laser ablation process, or a chemical vapor deposition process. Alternatively, the covering layer may be formed by a process including a vacuum process. This leads to the stability of the ultraviolet sensor. The diamond layer is preferably polycrystalline formed by a vapor growth process. This allows the diamond layer, which is highly controllable, to be readily manufactured.

According to the present invention, since moisture and organic compounds can be prevented from adhering to the exposed region of the diamond layer, the diamond layer is allowed to have constant responsivity without causing a deterioration in the ultraviolet transmittance and electrical properties of the diamond layer.

DESCRIPTION OF THE PREFERRED EMBODIMENTS

Figure 1:
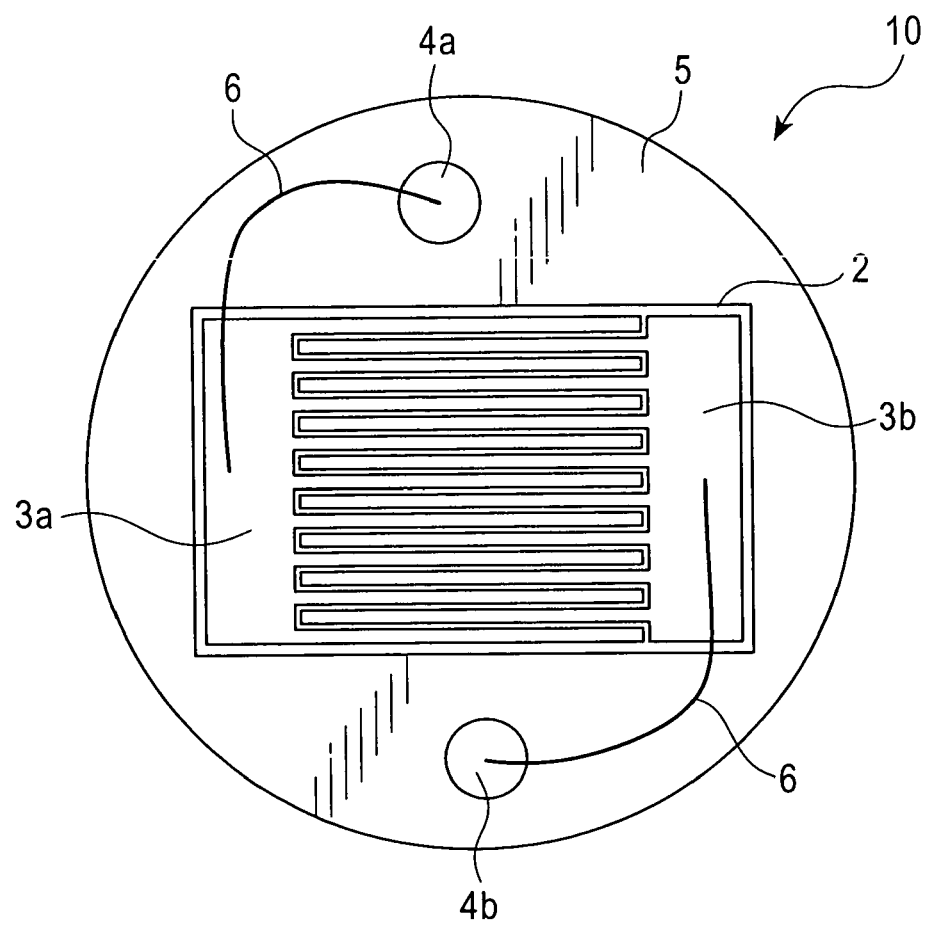
FIG. 1 is a plan view showing an ultraviolet sensor according to an embodiment of the present invention.
Figure 2:
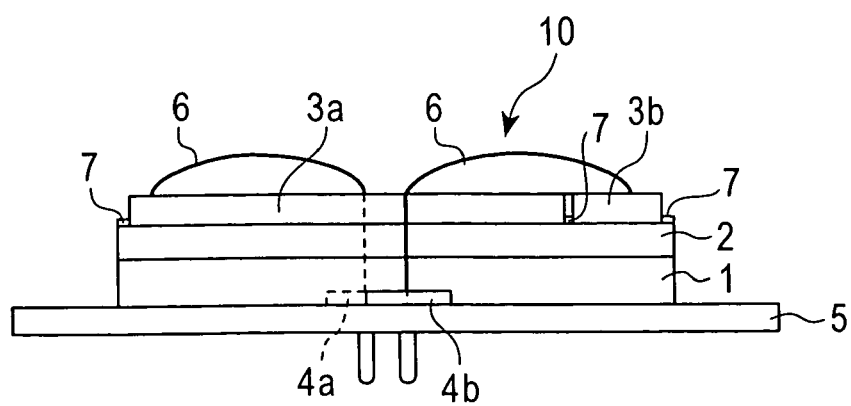
FIG. 2 is a schematic side view showing the ultraviolet sensor.

An ultraviolet sensor according to an embodiment of the present invention will now be described in detail with reference to the accompanying drawings. FIG. 1 is a plan view showing the ultraviolet sensor represented by reference numeral 10 and FIG. 2 is a schematic side view showing the ultraviolet sensor 10. With reference to FIGS. 1 and 2, the ultraviolet sensor 10 includes a substrate 1; an insulating diamond layer 2, placed thereon, functioning as a detector; a pair of a first interdigital electrode 3a and a second interdigital electrode 3b arranged on the insulating diamond layer 2; and a metal mount 5, such as a hermetic seal, having a first terminal 4a and a second terminal 4b thereon. The substrate 1, the insulating diamond layer 2, and the first and second interdigital electrodes 3a and 3b form a diamond element and are disposed on the metal mount 5 in that order. The first and second interdigital electrodes 3a and 3b are electrically connected to the first and second terminals 4a and 4b, respectively, with respective wires 6 made of, for example, gold.

The insulating diamond layer 2 has a surface region exposed from the first and second interdigital electrodes 3a and 3b and the ultraviolet sensor 10 further includes a covering layer 7, made of oxide or fluoride, lying on the surface region.

In view of ultraviolet transmittance and durability, in particular, the covering layer 7 is preferably made of at least one selected from the group consisting of alumina, silica, titania, and zirconia or fluoride containing at least one of calcium and magnesium. Since these oxides and the fluoride absorbs only a small amount of ultraviolet light, the ultraviolet sensor 10 has higher sensitivity as compared to sensors placed in packages in a hermetically sealed manner. Since these materials are effective in preventing the insulating diamond layer 2 from being damaged, the ultraviolet sensor 10 has high durability.

The covering layer 7 may have any thickness sufficient to prevent breakage and preferably has a thickness of, for example, 5 nm or more. In order to minimize the absorption of ultraviolet light, the upper limit of the thickness thereof is preferably 200 nm or less and more preferably 100 nm or less. According to this configuration, the amount of ultraviolet light absorbed by the covering layer 7 is greatly less than that of ultraviolet light absorbed by a window placed in a package of a known ultraviolet sensor. Therefore, the amount of ultraviolet light incident on the insulating diamond layer 2 is high and this leads to an increase in output. Furthermore, the thickness of the covering layer 7 is preferably equal to an odd multiple of constant A defined by the following equation:

$$A = (\lambda/2) \times (1/(2 \times n)) \quad (1)$$

wherein $\lambda$ represents the wavelength of light to be measured, n represents the refractive index of the covering layer 7 on which light with a wavelength $\lambda$ is incident, and d represents the thickness of the covering layer 7. This prevents reflection due to interference to enhance the intensity of light incident on the ultraviolet sensor 10.

A method for manufacturing the ultraviolet sensor 10 having the above configuration will now be described.

The insulating diamond layer 2 can be formed by a known process and is preferably formed by a chemical vapor deposition (CVD) process in terms of commercial production because the CVD process is superior in controllability and useful in forming diamond films with low cost with high reproducibility using plasma. In particular, the insulating diamond layer 2 preferably has a (100) surface and crystal grains oriented in a single direction. The insulating diamond layer 2 highly oriented is categorized into a polycrystalline layer in a broad sense and however has a lower density of crystal defects present at the surface thereof as compared to ordinary polycrystalline layers. This is because the growth directions of the crystal grains are aligned with each other, the in-plane directions thereof are also aligned with each other, and the insulating diamond layer 2 has a characteristic surface at which smooth (001) facets are arranged. Therefore, the insulating diamond layer 2 has a carrier mobility one order greater than that of ordinary one and this leads to the achievement of superior detection properties.

The substrate 1, which is not particularly limited, is preferably made of silicon and has a (001) surface when the insulating diamond layer 2 is highly oriented.

The first and second interdigital electrodes 3a and 3b may be made of an ordinary metal such as gold, platinum, or aluminum or conductive diamond. The first and second interdigital electrodes 3a and 3b can be formed by a known process such as a vapor deposition process, a sputtering process, an ion plating process, or a CVD process. In the ultraviolet sensor 10, the first and second interdigital electrodes 3a and 3b are arranged on the insulating diamond layer 2. The present invention is not limited to such a configuration and the ultraviolet sensor 10 may include a pair of any electrodes arranged on the insulating diamond layer 2. Such electrodes preferably have an interdigital shape or a fish bone shape with long portions facing each other. This increases the area of a region for detecting ultraviolet light to enhance the sensitivity. In order to measure ultraviolet light, in particular, the first and second interdigital electrodes 3a and 3b preferably have electrode fingers, arranged at intervals of 1 to 50 µm, having a width of 1 to 50 µm. The ultraviolet sensor 10 includes a pair of the first and second interdigital electrodes 3a and 3b. The present invention is not limited to such a configuration and the ultraviolet sensor 10 may include two or more pairs of electrodes. This allows the ultraviolet sensor 10 to be capable of measuring the distribution of ultraviolet light and allows the measurement to be performed if any one of the electrodes is faulty.

The covering layer 7 can be formed by a known process and is preferably formed by a vacuum process such as a sputtering process, an ion plating process, or a CVD process. In particular, the sputtering process and the CVD process, which use plasma, are preferable because these processes are effective in removing moisture and other compounds adsorbed on the surface. Before the covering layer 7 is formed, such adsorbed moisture and other compounds are preferably removed by sufficiently heating a sample.

The operation of the ultraviolet sensor 10 having the above configuration will now be described.

In the ultraviolet sensor 10, the insulating diamond layer 2 functions as a detector and a bias voltage is applied between the first and second interdigital electrodes 3a and 3b. Ultraviolet light incident on the insulating diamond layer 2 generates carriers (electrons and holes) therein. The carriers are moved by an electric field created by the bias voltage applied between the first and second interdigital electrodes 3a and 3b and then collected by the first and second interdigital electrodes 3a and 3b, whereby electrical signals are detected as output.

As described above, in the ultraviolet sensor 10, since the covering layer 7 made of oxide or fluoride lies on the surface of the diamond element, moisture and organic compounds are prevented from adhering to the exposed region of the insulating diamond layer 2; hence, the ultraviolet sensor 10 has stable response characteristics. Therefore, this type of ultraviolet sensor including a highly oriented diamond layer or a polycrystalline diamond layer formed with low cost can be used for various purposes and used in new applications. The ultraviolet sensor of the present invention significantly contributes to advances in industries using ultraviolet light, vacuum ultraviolet light, or deep ultraviolet light.

In the above description, the ultraviolet sensor of the present invention is used to measure ultraviolet light. The ultraviolet sensor can also be used to measure X-rays and soft X-rays with a wavelength less than that of ultraviolet light. In this case, the same advantage as that in measuring ultraviolet light can be obtained.

EXAMPLES

Ultraviolet sensors having the same configuration as that of the ultraviolet sensor 10 shown in FIG. 2 were prepared by the procedure below and then used as samples of an example of the present invention. A (001) silicon wafer 1 with low resistivity was prepared and then exposed to a mixture of methane plasma and hydrogen plasma, whereby the wafer surface was carbonized. A bias voltage was applied to the resulting wafer 1 in the mixture of methane plasma and hydrogen plasma, whereby diamond nuclei were formed on the wafer 1 by epitaxial growth. The application of the bias voltage to the wafer 1 was stopped and diamond was deposited on the wafer 1 for 15 hours using a gas mixture of methane and hydrogen under such conditions that a (100) diamond surface was primarily formed, whereby a highly-oriented insulating diamond layer 2 was formed on the wafer 1. The insulating diamond layer 2 had a (100) surface and a thickness of about 10 μm and crystal grains thereof were oriented in a single direction. The crystal grains arranged at the (100) surface of the insulating diamond layer 2 had a size of 3 to 5 μm.

The resulting wafer 1 was cleaned with bichromic acid, whereby carbonaceous components, other than diamond, present on the wafer 1 were removed. The resulting wafer 1 was rinsed with sulfuric acid and then cleaned with pure water. Patterns of interdigital electrodes were formed on the insulating diamond layer 2 by a photolithographic process, platinum was deposited on the resulting insulating diamond layer 2 by a magnetron sputtering process, and pairs of first and second electrodes 3a and 3b were then formed on the insulating diamond layer 2 by a lift-off process.

A resist was formed on the resulting insulating diamond layer 2 and then patterned by a photolithographic process, whereby a portion of the resist that was located on a pad section was allowed to remain. An aluminum target was sputtered in a gas mixture of argon and oxygen, whereby a covering layer 7, made of aluminum, having a thickness of 50 nm was formed.

The resulting wafer 1 was cut into chips, whereby elements were prepared. The elements each including a pair of the first and second interdigital electrodes 3a and 3b were each fixed to corresponding TO-5 type hermetic seals in such a manner that faces of the elements on which no first and second interdigital electrodes 3a and 3b were arranged were in contact with the hermetic seals. The hermetic seals each had corresponding first terminals 4a and second terminals 4b, which were bonded to the first and second interdigital electrodes 3a and 3b, respectively, with respective gold wires 6, whereby ultraviolet sensors having the same configuration as that of the ultraviolet sensor described in an embodiment of the present invention were obtained. Ultraviolet sensors used as samples of a comparative example were prepared by the same procedure for preparing the ultraviolet sensors of the example described above except that the covering layer 7 was not formed.

An ultraviolet sensor of the example and an ultraviolet sensor of the comparative example that had been prepared as described above were each placed in a measuring box that light cannot enter. Dark currents generated in the ultraviolet sensors were measured with a picoammeter while bias voltages were applied to the ultraviolet sensors. The measurement showed that the obtained dark currents did not differ from each other without depending on the presence of the covering layer 7 and were about 100 pA, that is, the leak currents of these ultraviolet sensors were sufficiently low for practical use.

Figure 3:
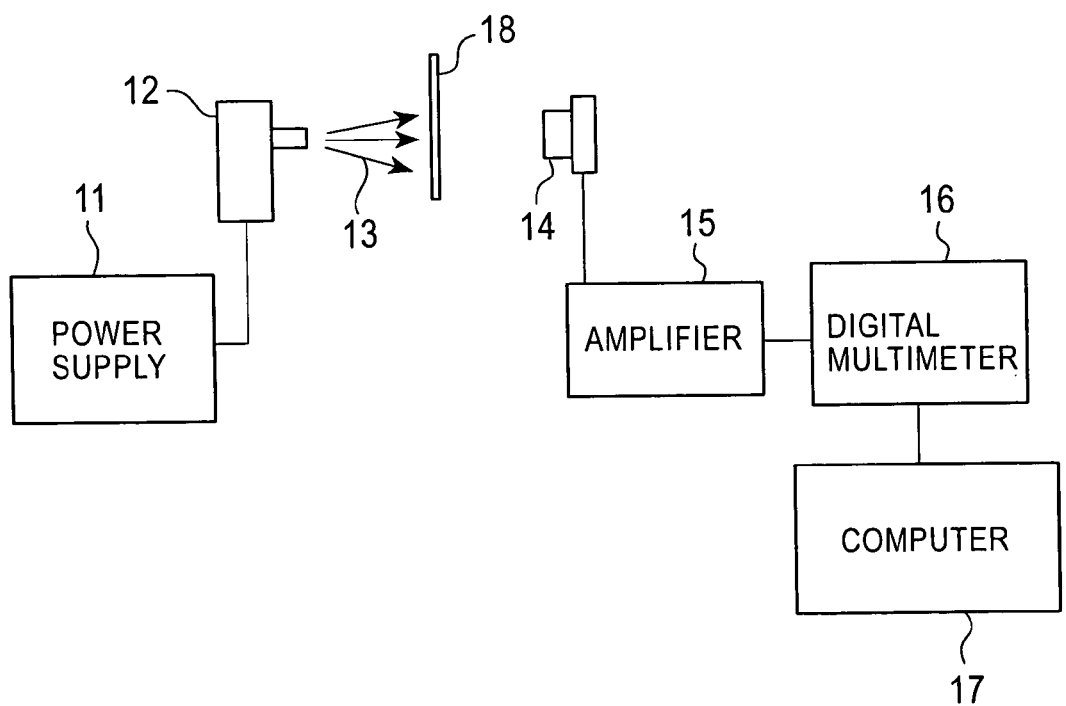
FIG. 3 is a schematic view showing a system for evaluating an ultraviolet sensor according to the present invention.

For an ultraviolet sensor of the example and an ultraviolet sensor of the comparative example, the responsivity to ultraviolet light was evaluated. FIG. 3 is a schematic view showing a system used for the evaluation. The system includes a light source 12 for irradiation. The light source 12 includes a deuterium lamp ($L_2D_2$ lamp), Type L7293, manufactured by Hamamatsu Photonics K.K. and is connected to a power supply 11, Type M-4518, manufactured by Hamamatsu Photonics K.K. The responsivity was measured as follows: a bias voltage of 15 V was applied between the first and second interdigital electrodes 3a and 3b of each ultraviolet sensor 14, a current generated by light irradiation was amplified with an amplifier 15 and then converted into a voltage with a digital multimeter 16, and the voltage was stored in a computer 17. In particular, ultraviolet light 13 was applied to the ultraviolet sensor 14 for 300 minutes by opening a shutter 18 in such a manner that the intensity of the ultraviolet light 13 was maintained constant, whereby a change in voltage was recorded in the computer 17.

Figure 4:
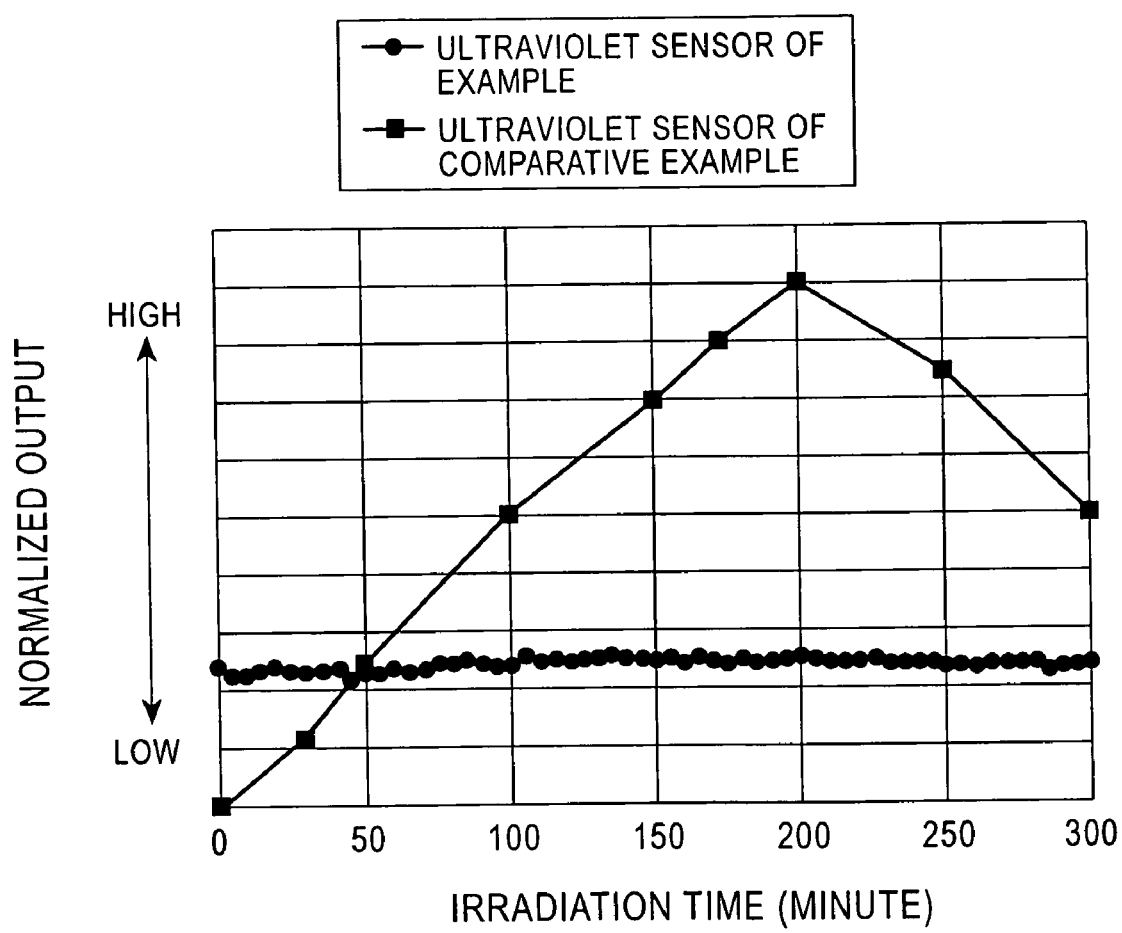
FIG. 4 is a graph showing a change in the responsivity of an ultraviolet sensor of an example and a change in the responsivity of an ultraviolet sensor of a comparative example, wherein the horizontal axis denotes the irradiation time and the vertical axis denotes the output.
Figure 5:
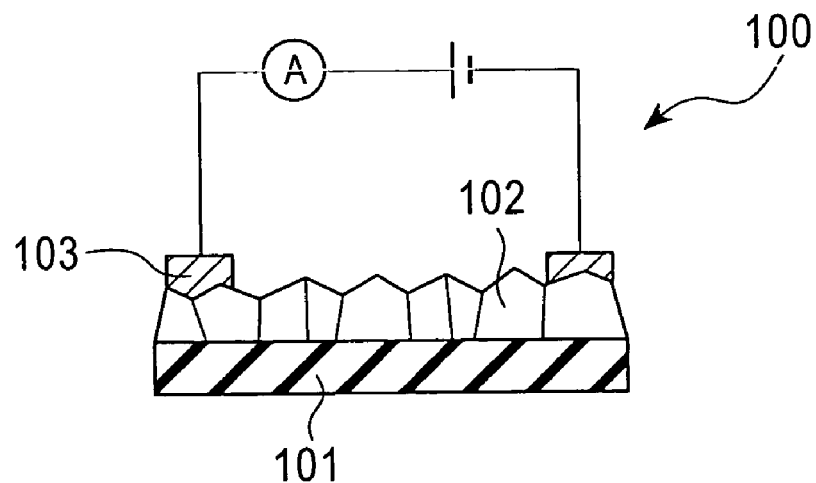
FIG. 5 is a schematic sectional view showing a known ultraviolet sensor with a plate structure.
Figure 6:
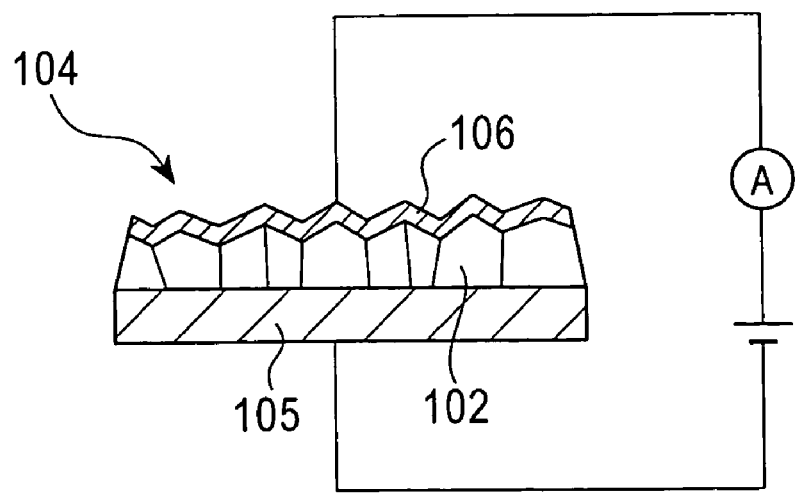
FIG. 6 is a schematic sectional view showing a known vertical ultraviolet sensor.

FIG. 4 is a graph showing a change in the responsivity of the ultraviolet sensor of the example and a change in the responsivity of the ultraviolet sensor of the comparative example. In FIG. 4, the horizontal axis denotes the irradiation time and the vertical axis denotes the output. The output shown in FIG. 4 corresponds to the voltage measured with the digital multimeter 16. As is clear from FIG. 4, the ultraviolet sensor of the example has a stable responsivity that does not change for a long time in contrast to the ultraviolet sensor of the comparative example that does not have the covering layer 7. Furthermore, the ultraviolet sensor of the example has substantially the same sensitivity as that of the ultraviolet sensor of the comparative example. This means that the aluminum layer does not cause a deterioration in sensitivity.

The following sensor was prepared: an ultraviolet sensor having the same configuration as those of the ultraviolet sensors of the example except that this ultraviolet sensor included an insulating diamond layer that was polycrystalline. The evaluation showed that the ultraviolet sensor had sensitivity lower than those of the ultraviolet sensors of the example that included the highly oriented diamond layers because the insulating diamond layer functioning as a detector had random orientation instead of (001) orientation. However, the ultraviolet sensor had greatly increased stability in responsivity because the insulating diamond layer was polycrystalline and therefore had a large surface area.

Furthermore, the following sensors were prepared: ultraviolet sensors having the same configuration as those of the ultraviolet sensors of the example except that these ultraviolet sensors included covering layers made of silica, titania, zirconia, magnesium fluoride, or calcium fluoride. The evaluation showed that these ultraviolet sensors as well as the ultraviolet sensors of the example had a stable responsivity that did not change for a long time.

What is claimed is:

1. An ultraviolet sensor comprising:
   a substrate;
   a diamond layer, placed on the substrate, functioning as a detector; and
   at least one pair of surface electrodes arranged on the diamond layer,
   wherein the diamond layer has a detecting region present at the surface thereof, the detecting region has at least one sub-region exposed from the surface electrodes, and the sub-region has a covering layer, made of oxide or fluoride, lying thereon, the oxide being at least one selected from the group consisting of alumina, silica, titania, and zirconia, the fluoride being at least one of calcium fluoride and magnesium fluoride.

2. The ultraviolet sensor according to claim 1, wherein the diamond layer is polycrystalline.

3. The ultraviolet sensor according to claim 1, wherein the diamond layer has a (100) surface and crystal grains which are arranged at the (100) surface, which are oriented in a single direction, and of which the in-plane directions are aligned with each other.

* * * * *